US008942946B2

(12) United States Patent
Tamura

(10) Patent No.: US 8,942,946 B2
(45) Date of Patent: Jan. 27, 2015

(54) TEST APPARATUS AND INFORMATION PROCESSING SYSTEM

(75) Inventor: Kazumoto Tamura, Gunma (JP)

(73) Assignee: Advantest Corporation, Tokyo (JP)

( * ) Notice: Subject to any disclaimer, the term of this patent is extended or adjusted under 35 U.S.C. 154(b) by 1112 days.

(21) Appl. No.: 12/945,736

(22) Filed: Nov. 12, 2010

(65) Prior Publication Data

US 2011/0208465 A1 Aug. 25, 2011

Related U.S. Application Data

(63) Continuation of application No. PCT/JP2008/064251, filed on Aug. 7, 2008.

(60) Provisional application No. 61/057,206, filed on May 30, 2008.

(51) Int. Cl.
*G06F 19/00* (2011.01)
*G01R 31/319* (2006.01)
(Continued)

(52) U.S. Cl.
CPC ...... *G01R 31/31907* (2013.01); *G01R 31/2834* (2013.01); *G01R 31/2851* (2013.01); *G06F 11/2733* (2013.01); *H04L 43/50* (2013.01); *G06F 11/277* (2013.01); *G01R 31/319* (2013.01); *G01R 31/31919* (2013.01); *G01R 31/31926* (2013.01); *G06F 11/273* (2013.01)
USPC ............ 702/108; 702/117; 702/118; 702/122

(58) Field of Classification Search
CPC ............... H04L 43/50; G01R 31/2834; G01R 31/2851; G06F 11/277; G06F 11/2733

USPC ................... 702/108, 117, 118, 122
See application file for complete search history.

(56) References Cited

U.S. PATENT DOCUMENTS 5,894,484 A * 4/1999 Illes et al. ............... 714/738
6,499,121 B1 * 12/2002 Roy et al. ............... 714/724
(Continued)

FOREIGN PATENT DOCUMENTS

JP S54-60537 A 5/1979
JP S55-56259 A 4/1980
(Continued)

OTHER PUBLICATIONS

Korean Office Action dated Sep. 30, 2011, in a counterpart Korean Patent application No. 10-2010-7025746 and JP H05-081165.
(Continued)

*Primary Examiner* — Sujoy Kundu
*Assistant Examiner* — Paul D Lee

(57) ABSTRACT

Provided is a test apparatus that tests a device under test, comprising a test unit that sends and receives signals to and from the device under test; a control apparatus that controls the test unit; and a relay apparatus that relays between the control apparatus and the test unit. The relay apparatus includes a first communicating section that receives a command from the control apparatus to the relay apparatus and transmits the command to the test unit; a second communicating section that receives a return command that is transmitted back to the relay apparatus by the test unit that received the command; and an executing section that executes a process designated by the return command, in response to the second communicating section receiving the return command.

10 Claims, 5 Drawing Sheets

(51) Int. Cl.
  *G01R 31/28* (2006.01)
  *G06F 11/273* (2006.01)
  *H04L 12/26* (2006.01)
  *G06F 11/277* (2006.01)

(56) References Cited

U.S. PATENT DOCUMENTS

| | | | |
|---|---|---|---|
| 7,340,364 B1 | 3/2008 | Kumaki | |
| 2002/0162059 A1* | 10/2002 | McNeely et al. | 714/703 |
| 2003/0033561 A1* | 2/2003 | Oonk | 714/42 |
| 2005/0034043 A1 | 2/2005 | Takizawa | |
| 2005/0149800 A1* | 7/2005 | Jones et al. | 714/726 |
| 2006/0123297 A1* | 6/2006 | Reichert et al. | 714/731 |
| 2006/0224926 A1 | 10/2006 | Iwamoto | |
| 2008/0028269 A1* | 1/2008 | Imming et al. | 714/738 |
| 2008/0091377 A1 | 4/2008 | Kumaki | |
| 2009/0063085 A1* | 3/2009 | Conner et al. | 702/117 |

FOREIGN PATENT DOCUMENTS

| | | |
|---|---|---|
| JP | 63-213018 A | 9/1988 |
| JP | 5-81165 A | 4/1993 |
| JP | 6-295268 A | 10/1994 |
| KR | 10-2006-0057600 A | 5/2006 |
| KR | 10-2007-0121020 A | 12/2007 |
| WO | 2008/044421 A1 | 4/2008 |

OTHER PUBLICATIONS

International Search Report (ISR) issued in PCT/JP2008/064251 (parent application) mailed in Nov. 2008 for Examiner consideration.
Written Opinion (PCT/ISA/237) issued in PCT/JP2008/064251 (parent application) mailed in Nov. 2008.
Japanese Office Action dated Jan. 18, 2011, in a related Japanese patent application JP2010-514326, which have English abstract.
Applicant brings the attention of the Examiner to the following pending U.S. Appl. No. 12/945,731, filed Nov. 12, 2010, 12/945,758, filed Nov. 12, 2010, and 12/942,915, filed Nov. 9, 2010.
International Search Report (ISR) issued in PCT/JP2008/065598 (related PCT application) mailed in Nov. 2008 for Examiner consideration.
Written Opinion (PCT/ISA/237) issued in PCT/JP2008/065598 (related PCT application) mailed in Nov. 2008.
International Search Report (ISR) issued in PCT/JP2008/064347 (related PCT application) mailed in Nov. 2008 for Examiner consideration.
Written Opinion (PCT/ISA/237) issued in PCT/JP20081064347 (related PCT application) mailed in Nov. 2008.
International Search Report (ISR) issued in PCT/JP2008/064349 (related PCT application) mailed in Nov. 2008 for Examiner consideration.
Written Opinion (PCT/ISA/237) issued in PCT/JP20081064349 (related PCT application) mailed in Nov. 2008.

* cited by examiner

| TIME | CONTROL APPARATUS 14 | RELAY APPARATUS 16 | SENDING/ RECEIVING SECTION 48 OF THE TEST UNIT | FUNCTIONAL TESTING SECTION 42 OF THE TEST UNIT |
|---|---|---|---|---|
| 1 | swt TH1 PG DATA | | | |
| 2 | | swt TH1 PG DATA | | |
| 3 | | | | |
| 4 | | | | |
| 5 | | | | |
| 6 | | | swt TH1 PG DATA | |
| 7 | | | | swt TH1 PG DATA |

*FIG. 3*

| TIME | CONTROL APPARATUS 14 | RELAY APPARATUS 16 | SENDING/ RECEIVING SECTION 48 OF THE TEST UNIT | FUNCTIONAL TESTING SECTION 42 OF THE TEST UNIT |
|---|---|---|---|---|
| 1 | | | | |
| 2 | srd TH1 PG | | | |
| 3 | | srd TH1 PG | | |
| 4 | | | | |
| 5 | | | | |
| 6 | | | | |
| 7 | | | srd TH1 PG | |
| 8 | | | | srd TH1 PG |
| 9 | | | srd TH1 PG DATA | |
| 10 | | | | |
| 11 | | | | |
| 12 | | srd TH1 PG DATA | | |
| 13 | srd TH1 PG DATA | | | |

*FIG. 4*

| TIME | CONTROL APPARATUS 14 | | RELAY APPARATUS 16 | | SENDING/ RECEIVING SECTION 48 OF THE TEST UNIT | | FUNCTIONAL TESTING SECTION 42 OF THE TEST UNIT |
|---|---|---|---|---|---|---|---|
| 1 | | | | | | | |
| 2 | | | | | | | |
| 3 | swt TimerStart | | | | | | |
| 4 | | | swt TimerStart | | | | |
| 5 | | | | | | | |
| 6 | | | | | | | |
| 7 | | | | | | | |
| 8 | | | | | swt TimerStart | | |
| 9 | | | | | | | |
| 10 | | | | | | | |
| 11 | | | | | | | |
| 12 | | | TIMER OPERATION INITIATION | | | | |
| 13 | | | | | | | |
| 14 | | | | | | | |
| 15 | | | | | | | |
| 16 | | | | | | | |
| 17 | | | | | | | |

*FIG. 5*

| TIME | CONTROL APPARATUS 14 | | RELAY APPARATUS 16 | | SENDING/ RECEIVING SECTION 48 OF THE TEST UNIT | | FUNCTIONAL TESTING SECTION 42 OF THE TEST UNIT |
|---|---|---|---|---|---|---|---|
| 11 | | | | | | | |
| 12 | | | TIMER OPERATION INITIATION | | | | |
| 13 | | | | | | | |
| 14 | | | | | | | |
| 15 | | | | | | | |
| 16 | srd TimerRead | | | | | | |
| 17 | | | srd DATA | | | | |
| 18 | srd DATA | | | | | | |

*FIG. 6*

TEST APPARATUS AND INFORMATION PROCESSING SYSTEM

BACKGROUND

1. Technical Field

The present invention relates to a test apparatus and an information processing system for testing a device under test.

2. Related Art

A test apparatus for testing a semiconductor device or the like includes one or more test units and a control apparatus. Each test unit supplies a test signal to the device under test.

The control apparatus can be realized as a computer connected to the test units via a serial communication cable or the like. The control apparatus issues a command to each of the test units to control the test units. Furthermore, this test apparatus includes, near the control apparatus, a timer apparatus or the like that is frequently accessed by the control apparatus.

One idea considered here is a sequence that involves the timer apparatus beginning to measure time at a timing when a test unit begins a prescribed process, and after a set time has passed, having the test unit begin another process. In this case, the control apparatus issues a command to the test unit to begin the prescribed process, then issues a timer initiation command instructing the timer apparatus to begin measuring time, and finally, after the set time has passed, issues a command to the test unit to begin another process.

When performing this sequence, however, if the propagation time of a command from the control apparatus to the test unit is longer than the propagation time of a command from the control apparatus to the timer apparatus, the timer apparatus begins measuring time before the test unit begins the prescribed process. Accordingly, when performing this sequence, the order of execution of the processes by the test unit and the timer apparatus may not match the order of the commands issued by the control apparatus.

One idea for solving this problem involves issuing a read command to the test unit after the command for the test unit to begin the prescribed process and before the timer initiation command, and then issuing the timer initiation command after receiving from the test unit the data read in response to the read command. As a result, the command issued to the test unit before the timer initiation command ensures that the test unit will already have begun the process. In other words, the order of execution of the processes by the test unit and the timer apparatus can be made the same as the order of the commands issued by the control apparatus.

However, the control apparatus that issues the read command cannot issue another command until receiving from the test unit the data read in response to the read command. Accordingly, when a read command to the test unit is inserted before the timer initiation command, the control apparatus cannot eliminate the pointless wait time.

SUMMARY

Therefore, it is an object of an aspect of the innovations herein to provide a test apparatus and an information processing system, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a test apparatus that tests a device under test, comprising a test unit that sends and receives signals to and from the device under test; a control apparatus that controls the test unit; and a relay apparatus that relays between the control apparatus and the test unit. The relay apparatus includes a first communicating section that receives a command from the control apparatus to the relay apparatus and transmits the command to the test unit; a second communicating section that receives a return command that is transmitted back to the relay apparatus by the test unit that received the command; and an executing section that executes a process designated by the return command, in response to the second communicating section receiving the return command.

According to a second aspect related to the innovations herein, provided is an information processing system comprising a processing unit; a control apparatus that controls the processing unit; and a relay apparatus that relays between the control apparatus and the processing unit. The relay apparatus includes a first communicating section that receives a command from the control apparatus to the relay apparatus and transmits the command to the processing unit; a second communicating section that receives a return command that is transmitted back to the relay apparatus by the processing unit that received the command; and an executing section that executes a process designated by the return command, in response to the second communicating section receiving the return command.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows exemplary propagation of a write command issued to the test unit 12 by the control apparatus 14.

FIG. 4 shows exemplary propagation of a read command issued to the test unit 12 by the control apparatus 14.

FIG. 5 shows a first exemplary propagation of a timer initiation command issued to the relay apparatus 16 by the control apparatus 14.

FIG. 6 shows a first exemplary propagation of a read command issued to the relay apparatus 16 by the control apparatus 14.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
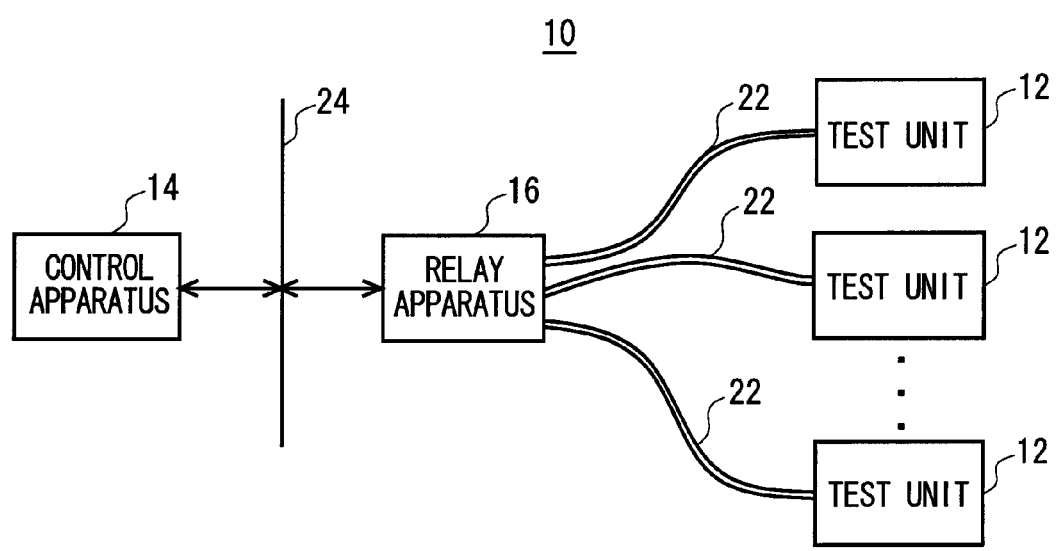
FIG. 1 shows a configuration of a test apparatus 10 according to an embodiment of the present invention.

FIG. 1 shows a configuration of a test apparatus 10 according to an embodiment of the present invention. The test apparatus 10 tests a device under test such as a semiconductor device. The test apparatus 10 includes one or more test units 12, a control apparatus 14, and a relay apparatus 16.

Each test unit 12 sends and receives signals to and from the device under test. For example, each test unit 12 may supply the device under test with a test signal having a waveform corresponding to a test pattern, and judge acceptability of the device under test by comparing a response signal from the device under test to a logic value corresponding to an expected value pattern.

The control apparatus 14 provides a command to each of the one or more test units 12 to control the test units 12. The control apparatus 14 may be realized as a computer that functions as the control apparatus 14 by executing a program.

The relay apparatus 16 relays commands and responses between the control apparatus 14 and the one or more test units 12. For example, one or more transmission lines 22, which each have a length of several meters, may be connected between the relay apparatus 16 and one or more test units 12 to transmit serial data. A tester bus 24 may be connected between the control apparatus 14 and the relay apparatus 16 to transmit parallel data.

Figure 2:
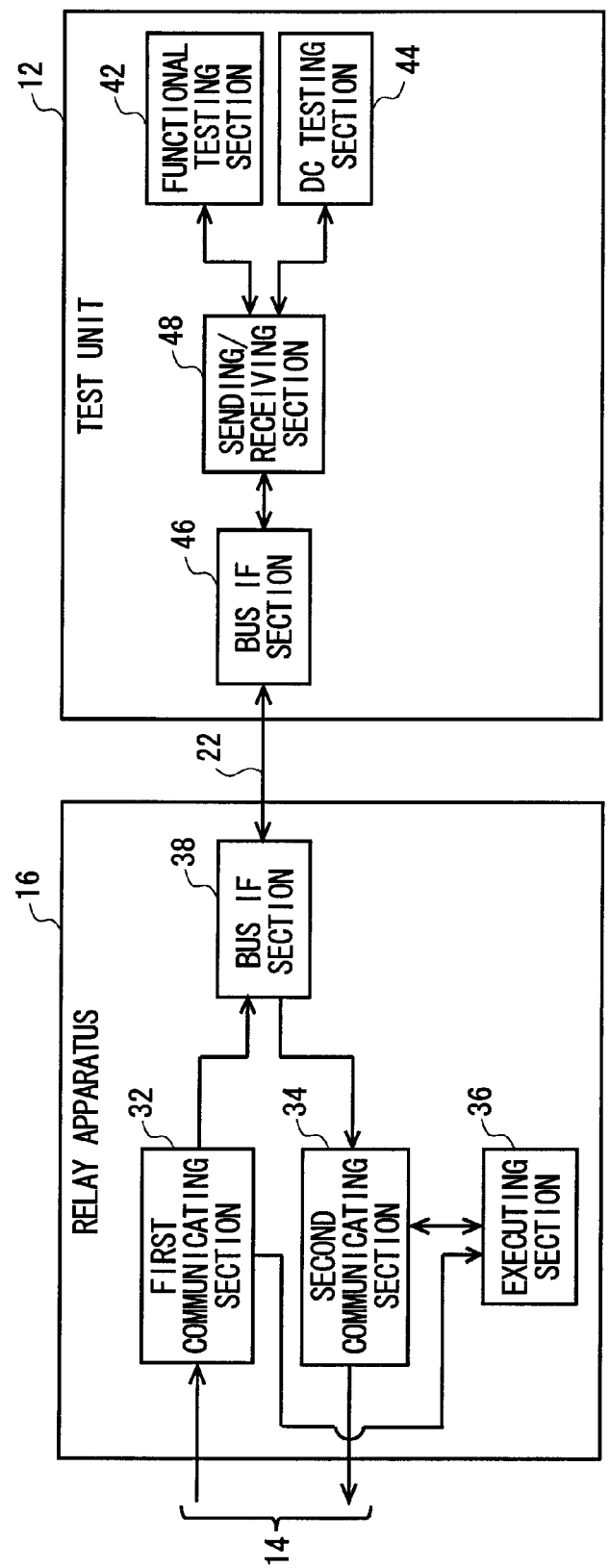
FIG. 2 shows configurations of test unit 12 and the relay apparatus 16 according to the present embodiment.

FIG. 2 shows configurations of test unit 12 and the relay apparatus 16 according to the present embodiment. The relay apparatus 16 includes a first communicating section 32, a second communicating section 34, an executing section 36, and a bus IF section 38.

The first communicating section 32 receives from the control apparatus 14 commands transmitted from the control apparatus 14 to the test unit 12. The first communicating section 32 generates packets including the received commands. The first communicating section 32 transmits each of the generated packets to the transmission line 22 connected to the test unit 12 that is the transmission destination for the packet, via the bus IF section 38.

The second communicating section 34 receives, via the bus IF section 38, packets transmitted from the one or more test units 12. The second communicating section 34 extracts commands or responses to commands transmitted thereto included in the packets. The second communicating section 34 transmits to the control apparatus 14 the extracted commands or responses.

The executing section 36 receives commands provided to the relay apparatus 16, and performs the processes designated by the commands. For example, the executing section 36 may perform a timer operation or a counter operation.

When performing a timer operation, the executing section 36 begins measuring time upon receiving a time initiation command. The executing section 36 stops measuring time after a predetermined set time has passed from when time measurement was begun. When time measurement is finished, the executing section 36 may write information such as a flag indicating that time measurement is finished to a register, and supply an interrupt to the source that issued the timer initiation command. The executing section 36 may continue measuring time until a timer end command or a timer pause command is provided thereto.

The bus IF section 38 converts the data transmitted from the relay apparatus 16 to the test unit 12, from a format such as parallel data that can be handled by the relay apparatus 16 to a format such as serial data that can be transmitted on the transmission line 22. The bus IF section 38 also converts data sent from the test unit 12 to the relay apparatus 16, from a format such as serial data that can be transmitted on the transmission line 22 to a format such as parallel data that can be handled by the relay apparatus 16.

The one or more test units 12 each include a functional testing section 42, a DC testing section 44, a bus IF section 46, and a sending/receiving section 48. The functional testing section 42 performs functional testing on the device under test. The functional testing section 42 operates according to a command received from the control apparatus 14.

The DC testing section 44 supplies DC power supply voltage to the device under test. The DC testing section 44 performs DC testing on the device under test. The DC testing section 44 operates according to a command from the control apparatus 14.

The bus IF section 46 converts the data transmitted from the test unit 12 to the relay apparatus 16, from a format such as parallel data that can be handled by the test unit 12 to a format such as serial data that can be transmitted on the transmission line 22. The bus IF section 46 converts the data transmitted from the relay apparatus 16 to the test unit 12, from a format such as serial data that can be transmitted on the transmission line 22 to a format such as parallel data that can be handled by the test unit 12.

The sending/receiving section 48 receives, from the relay apparatus 16 via the bus IF section 46, packets including commands or responses sent from the control apparatus 14 to the test unit 12. The sending/receiving section 48 extracts the commands or responses included in the packets. The sending/receiving section 48 transmits the extracted commands or responses to the functional testing section 42 or the DC testing section 44.

The sending/receiving section 48 receives commands or responses to be transmitted from the functional testing section 42 and the DC testing section 44 to the control apparatus 14. The sending/receiving section 48 generates packets including the received commands or responses. The sending/receiving section 48 transmits the generated packets to the relay apparatus 16 via the bus IF section 46.

Upon receiving commands from the control apparatus 14 causing the executing section 36 to perform processes, such as a timer initiation command or a counter initiation command, the relay apparatus 16 and the test unit 12 having the configurations described above operate in the following manner. First, the first communicating section 32 of the relay apparatus 16 receives a command transmitted from the control apparatus 14 to the relay apparatus 16.

Upon receiving the command issued from the control apparatus 14 to the relay apparatus 16, the first communicating section 32 then generates a packet including the command and transmits the packet to the test unit 12. In this case, the first communicating section 32 may transmit the packet including the command to one test unit 12, or may transmit the packet including the command to each of a plurality of test units 12 connected to the relay apparatus 16.

Next, upon receiving the command from the relay apparatus 16, the sending/receiving section 48 of the test unit 12 generates a return command for returning the received command to the relay apparatus 16. The sending/receiving section 48 generates a packet including the return command and transmits the packet back to the relay apparatus 16.

Next, upon receiving the packet including the return command, the second communicating section 34 of the relay apparatus 16 supplies the executing section 36 with the return command included in the received packet. The executing section 36 performs the process designated by the return command, such as a timer operation or a counter operation, in response to the second communicating section 34 receiving the return command. When the first communicating section 32 transmits commands to a plurality of test units 12, the executing section 36 may execute the process designated by the return command in response to return commands being received from all of the test units 12.

In this way, when a command indicating execution initiation is transmitted from the control apparatus 14 to the to the executing section 36 in the relay apparatus 16, the relay apparatus 16 initiates execution by the executing section 36 after receiving this command that is transmitted to and returned from the test unit 12. As a result, even when the command propagation time from the control apparatus 14 to the test unit 12 is longer than the command propagation time from the control apparatus 14 to the executing section 36, the test apparatus 10 can cause the execution order of the commands by the test unit 12 and the executing section 36 to match the execution issuance order of commands by the control apparatus 14.

Furthermore, the control apparatus 14 preferably issues write commands as the commands instructing the executing section 36 in the relay apparatus 16 to begin execution. As a result, the control apparatus 14 can execute other processes and issue subsequent commands after issuing this command, and can therefore cause the relay apparatus 16 to operate without incurring a pointless wait time.

Upon receiving from the control apparatus 14 a read command for reading the result of a process executed by the executing section 36, such as a timer read command or a counter read command, the relay apparatus 16 having the configuration described above operates in the following manner. First, the first communicating section 32 of the relay apparatus 16 receives a read command for reading an execution result of the executing section 36 transmitted from the control apparatus 14.

Next, the executing section 36 sends the execution result back to the control apparatus 14 via the second communicating section 34, in response to the first communicating section 32 receiving the read command. The relay apparatus 16 may perform the same processes upon receiving, instead of a read command for reading an execution result, a setting command for setting a value in the executing section 36 or a pause command for temporarily stopping the process of the executing section 36.

In this way, when a read command is transmitted from the control apparatus 14 to the executing section 36 in the relay apparatus 16, the relay apparatus 16 sends a response corresponding to the read command back to the control apparatus 14, without transferring the response to the test unit 12. As a result, the test apparatus 10 can send a response to the read command back to the control apparatus 14 in a short time.

FIG. 3 shows exemplary propagation of a write command issued to the test unit 12 by the control apparatus 14. In FIG. 3, the vertical axis represents time and the horizontal axis represents the propagation position of the command at each time. FIGS. 4 to 7 use the same format.

In FIG. 3, commands beginning with "swt" represent write commands for writing data to a designated address in a storage apparatus. The term "TH1 PG" following the "swt" in the write commands represents an address designating the location to write the data to. The term "DATA1" following the address, e.g. "TH1 PG," in the write commands represents the data to be written. FIGS. 4 to 7 use the same format.

The write command shown in FIG. 3 is issued by the control apparatus 14. The write command issued by the control apparatus 14 is sequentially transmitted in the following order: control apparatus 14→relay apparatus 16→sending/receiving section 48 of the test unit 12→functional testing section 42 of the test unit 12. Upon receiving the write command, the functional testing section 42 of the test unit 12 writes the data contained in the write command to the designated address.

Upon issuing the write command, the control apparatus 14 can then perform a subsequent process immediately after the write command is issued. Accordingly, in the example of FIG. 3, the control apparatus 14 can perform other processes from time 2 onward.

Figure 7:
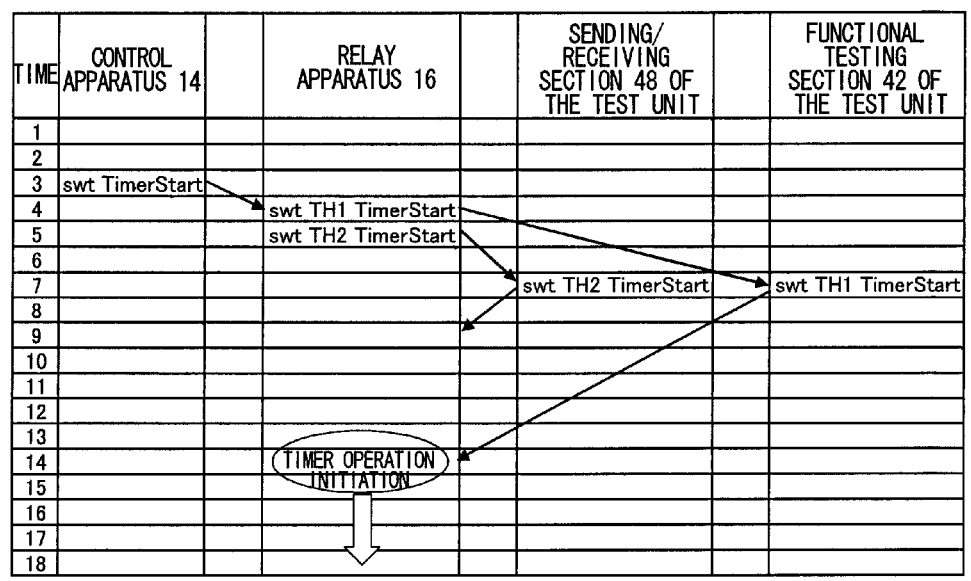
FIG. 7 shows a second exemplary propagation of a timer initiation command issued to the relay apparatus 16 by the control apparatus 14.

FIG. 4 shows exemplary propagation of a read command issued to the test unit 12 by the control apparatus 14. In FIG. 4, commands beginning with "srd" represent read commands for reading data from a designated address in a storage apparatus. The term "TH1 PG" following the "srd" in the read commands represents an address designating the location to read the data from. In FIG. 4, the command included in "DATA" following "srd TH1 PG" represents a response corresponding to the read command. In this case, "DATA" represents data read in response to the read command. FIGS. 5 to 7 use the same format.

The read command shown in FIG. 4 is issued by the control apparatus 14. The read command issued by the control apparatus 14 is sequentially transmitted in the following order: control apparatus 14→relay apparatus 16→sending/receiving section 48 of the test unit 12→functional testing section 42 of the test unit 12. Upon receiving the read command, the functional testing section 42 of the test unit 12 reads the data from the address indicated by the read command, and issues a response that contains the read data. The response issued by the functional testing section 42 of the test unit 12 is sequentially transmitted in the following order: functional testing section 42 of the test unit 12→sending/receiving section 48 of the test unit 12→relay apparatus 16→control apparatus 14.

Upon issuing the read command, the control apparatus 14 cannot perform a subsequent process until the response is received. Accordingly, in the present example, the control apparatus 14 cannot perform processes from time 2 to time 13.

FIG. 5 shows a first exemplary propagation of a timer initiation command issued to the relay apparatus 16 by the control apparatus 14. In FIG. 5, the command labeled "swt TimerStart" represents a write command for the executing section 36 in the relay apparatus 16 to begin the timer operation. FIG. 7 uses the same labeling.

The timer initiation command shown in FIG. 5 is issued by the control apparatus 14. The timer initiation command issued by the control apparatus 14 is transmitted from the control apparatus 14 to the relay apparatus 16. Upon receiving the timer initiation command, the relay apparatus 16 transmits the timer initiation command to the test unit 12.

Next, upon receiving the timer initiation command from the relay apparatus 16, the sending/receiving section 48 of the test unit 12 sends the received command back to the relay apparatus 16 as a return command. The executing section 36 of the relay apparatus 16 begins the timer operation in response to receiving the return command from the test unit 12.

With the test apparatus 10 described above, an issued timer initiation command does not reach the executing section 36 of the relay apparatus 16 prior to a command issued after this timer initiation command reaching the test unit 12. As a result, the test apparatus 10 can cause the execution order of the commands by the test unit 12 and the executing section 36 to match the execution issuance order of commands by the control apparatus 14.

Furthermore, the control apparatus 14 issues the timing initiation command as a write command. Accordingly, the control apparatus 14 can perform a subsequent process immediately after issuing the timer initiation command. Accordingly, the test apparatus 10 can begin the timer operation without the control apparatus 14 incurring a pointless wait time. When operations other than the timer operation, such as the counter operation, are begun by the executing section 36 of the relay apparatus 16, the test apparatus 10 transmits commands similar to the timer initiation commands.

FIG. 6 shows a first exemplary propagation of a timer read command issued to the relay apparatus 16 by the control apparatus 14. In FIG. 6, the command labeled "srd Timer-Read" represents a timer read command for the executing section 36 in the relay apparatus 16 to read the time measurement result.

The timer read command shown in FIG. 6 is issued by the control apparatus 14. The timer read command issued by the control apparatus 14 is transmitted from the control apparatus 14 to the relay apparatus 16. Upon receiving the timer read command, the relay apparatus 16 reads the current time measurement result of the timer and issues a response that includes the read data. The response issued by the relay apparatus 16 is transmitted to the control apparatus 14.

In this way, when the control apparatus 14 reads a time measurement result of the timer, the relay apparatus 16 responds directly without transmitting a command to the test unit 12. As a result, the control apparatus 14 can read the time measurement results of the timer in a short time. When setting an initial value of the timer, halting the timer operation, or the like, the control apparatus 14 may issue read commands similar to the timer read command.

FIG. 7 shows a second exemplary propagation of a timer initiation command issued to the relay apparatus 16 by the control apparatus 14. When the test apparatus 10 includes a plurality of test units 12, the timer initiation command issued by the control apparatus 14 may be propagated as shown in FIG. 7, instead of as shown in FIG. 5.

In other words, upon receiving the timer initiation command from the control apparatus 14, the relay apparatus 16 transmits the timer initiation command to each of the test units 12. Next, upon receiving the timer initiation command from the relay apparatus 16, the sending/receiving sections 48 of the test units 12 each send the received command back to the relay apparatus 16 as a return command.

The executing section 36 of the relay apparatus 16 begins the timer operation in response to receiving the return commands from all of the test units 12. As a result, even when the command propagation time from the relay apparatus 16 to each of the test units 12 is different, the test apparatus 10 can cause the execution order of the commands by the test units 12 and the executing section 36 to match the issuance order of commands by the control apparatus 14.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The technology described via the above embodiments is not limited to use in a test apparatus 10, and can be applied in a common information processing system. For example, the technology described via the above embodiments can be applied in an information processing system that includes one or more processing units that process information, a control apparatus that controls the processing units, and a relay apparatus that relays between the control apparatus and the processing units. In this case, the processing units of the information processing system have the same function and configuration as the test units 12 according to the above embodiments, the control apparatus of the information processing system has the same function and configuration as the control apparatus 14 according to the above embodiments, and the relay apparatus of the information processing system has the same function and configuration as the relay apparatus 16 according to the above embodiments.

What is claimed is:

1. A test apparatus that tests a device under test, comprising:
   a test unit that sends and receives signals to and from the device under test;
   a control apparatus that controls the test unit; and
   a relay apparatus that relays between the control apparatus and the test unit, wherein
   the relay apparatus includes a first communicating section that receives a command from the control apparatus to the relay apparatus and transmits the command to the test unit,
   the test unit, upon receiving the command from the relay apparatus, transmits the received command back to the relay apparatus as a return command, and
   the relay apparatus further includes:
   a second communicating section that receives the return command that is transmitted back to the relay apparatus by the test unit that received, the command; and
   an executing section that executes a process designated by the return command, in response to the second communicating section receiving the return command.

2. The test apparatus according to claim 1, wherein the executing section begins a timer operation or a counter operation in response to receiving, the return command.

3. The test apparatus according to claim 1, comprising, a plurality of the test units, wherein
   the relay apparatus relays between the control apparatus and each of the test units,
   the first communicating section transmits the command to each of the test units, and
   in response to receiving the return commands front all of the test units, the executing section executes the process designated by the return commands.

4. The test apparatus according to claim 1, wherein
   the first communicating section receives from the control apparatus a read command for reading an execution result of the executing section, and
   the executing section transmits the execution result back to the control apparatus in response to the first communicating section receiving the read command.

5. A test apparatus that tests a device under test, comprising:
   a test unit that sends and receives signals to and from the device under test;
   a control apparatus that controls the test unit; and
   a relay apparatus that relays between the control apparatus and the test unit, wherein
   the relay apparatus includes a first communicating section that receives a command from the control apparatus to the relay apparatus and transmits the command to the test unit,
   the test unit, upon receiving the command from the relay apparatus, transmits the received command back to the relay apparatus as a return command, and
   the relay apparatus further includes:
   a second communicating section that receives the return command that is transmitted back to the relay apparatus by the test unit that received the command; and
   an executing section that executes a process designated by the return command, in response to the second communicating section receiving the return command,
   the control apparatus issues a write command to the relay apparatus, the first communicating section of the relay apparatus transmits the write command issued by the control apparatus to the test unit, upon receiving the write command from the relay apparatus, the test unit transmits the received write command to the relay apparatus as the return command, and the executing section of the relay apparatus executes as process in response to receiving the return command from the test unit.

6. An information processing, system comprising:

a processing unit:

a control apparatus that controls the processing unit; and a relay apparatus that relays between the control apparatus and the processing unit, wherein the relay apparatus includes a first communicating section that receives a command from the control apparatus to the relay apparatus and transmits the command to the processing unit, the test unit, upon receiving the command from the relay apparatus, transmits the received command back to the relay apparatus as a return command, and the relay apparatus further includes:

a second communicating section that receives the return command that is transmitted back to the relay apparatus by the processing unit that received the command; and an executing section that executes a process designated by the return command, in response to the second communicating section receiving the return command.

7. The information processing system according to claim 6, wherein the executing section begins a timer operation or a counter operation in response to receiving the return command.

8. The information processing system according to claim 6, comprising a plurality of the processing units, wherein the relay apparatus relays between the control apparatus and each of the processing units, the first communicating section transmits the command to each of the processing units, and in response to receiving the return commands from all of the processing units, the executing section executes the process designated by the return commands.

9. The information processing system according to claim 6, wherein the control apparatus issues a write command to the relay apparatus, the first communicating section of the relay apparatus transmits the write command issued by the control apparatus to the processing unit, upon receiving the write command from the relay apparatus, the processing unit transmits the received write command to the relay apparatus as the return command, and the executing section of the relay apparatus executes a process in response to receiving the return command from the processing unit.

10. The information processing system according to claim 6, wherein the first communicating section receives from the control apparatus a read command for reading an execution result of the executing section, and the executing section transmits the execution result back to the control apparatus in response to the first communicating section receiving the read command.

* * * * *